(12) United States Patent
Liu (10) Patent No.: US 11,831,328 B2
(45) Date of Patent: Nov. 28, 2023

(54) ELECTRONIC DEVICE AND METHOD CAPABLE OF PREDICTING AND GENERATING COMPENSATION CHARGE AMOUNT(S) IN RESPONSE TO SWITCHING OF CDAC

(71) Applicant: PixArt Imaging Inc., Hsin-Chu (TW)

(72) Inventor: Shiue-Shin Liu, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 54 days.

(21) Appl. No.: 17/666,494

(22) Filed: Feb. 7, 2022

(65) Prior Publication Data

US 2023/0253978 A1 Aug. 10, 2023

(51) Int. Cl.
*H03M 1/06* (2006.01)
*H03M 1/80* (2006.01)
*H03M 1/46* (2006.01)
*H03K 19/20* (2006.01)

(52) U.S. Cl.
CPC ........... *H03M 1/802* (2013.01); *H03M 1/462* (2013.01); *H03K 19/20* (2013.01)

(58) Field of Classification Search
CPC .... H03M 1/804; H03M 1/0863; H03M 1/468; H03M 1/0604; H03M 1/0845; H03M 1/0678; H03M 1/66; H03M 1/462; H03M 1/38; H03M 1/466; H03M 1/56; H03M 1/12; H03M 1/0612; H03M 1/0602; H03M 1/00; H03M 1/1071; H03M 1/1009; H03M 1/08; H03M 1/403; H03M 1/46; H03M 3/454

USPC ........ 341/118, 119, 120, 121, 150, 161, 172
See application file for complete search history.

(56) References Cited

U.S. PATENT DOCUMENTS

| | | | | |
|---|---|---|---|---|
| 7,129,875 | B1 * | 10/2006 | Altun | H03M 3/322 341/120 |
| 8,570,206 | B1 * | 10/2013 | Lin | H03M 1/144 341/163 |
| 8,749,425 | B1 * | 6/2014 | Hu | H03M 1/0845 341/172 |
| 9,223,332 | B1 * | 12/2015 | Himmelbauer | G05F 1/10 |
| 9,537,498 | B2 * | 1/2017 | Liu | H03M 1/66 |
| 9,800,258 | B2 * | 10/2017 | Martens | H03M 1/1061 |
| 9,935,643 | B1 * | 4/2018 | Chang | H03M 1/462 |
| 2013/0182803 | A1 * | 7/2013 | Ishii | H03M 1/687 375/345 |
| 2014/0168000 | A1 * | 6/2014 | Lemkin | H03M 1/1245 341/172 |
| 2015/0146066 | A1 * | 5/2015 | Gou | H03M 1/18 348/308 |
| 2017/0346498 | A1 * | 11/2017 | Lin | H03M 1/468 |
| 2019/0229741 | A1 * | 7/2019 | Linkewitsch | H03M 1/0678 |

* cited by examiner

*Primary Examiner* — Linh V Nguyen
(74) *Attorney, Agent, or Firm* — Winston Hsu (57) ABSTRACT

A method of an electronic device includes: providing a capacitive digital-to-analog converter having a reference voltage input; providing a reference voltage providing circuit to generate a reference voltage to the reference voltage input of the capacitive digital-to-analog converter; and, generating a compensation signal into the reference voltage input of the capacitive digital-to-analog converter in response to at least one switching of at least one capacitor in a switchable capacitor network of the capacitive digital-to-analog converter.

14 Claims, 4 Drawing Sheets

ELECTRONIC DEVICE AND METHOD CAPABLE OF PREDICTING AND GENERATING COMPENSATION CHARGE AMOUNT(S) IN RESPONSE TO SWITCHING OF CDAC

BACKGROUND OF THE INVENTION

1. Field of the Invention

The invention relates to a digital-to-analog conversion scheme, and more particularly to an electronic device comprising a digital-to-analog conversion device and a corresponding method.

2. Description of the Prior Art

Generally speaking, a conventional successive-approximation register analog-to-digital conversion/converter (SAR ADC) device employs a conventional capacitive digital-to-analog conversion/converter (CDAC) circuit which is arranged to receive a reference voltage signal to convert a digital input signal into an analog output signal/voltage. However, the conventional CDAC will draw charge amounts from the reference voltage signal each time when one or more capacitors in the conventional CDAC perform level switching. This inevitably causes a voltage drop occurring in the reference voltage signal to significantly lower down the level of reference voltage signal. The reference voltage signal is provided by a conventional voltage provider circuit which may slowly and gradually raise up the much lower level of reference voltage signal after the significant voltage drop occurs in the reference voltage signal. However, if the conventional SAR ADC device operates at a higher speed, then the settle time of each bit conversion of the conventional CDAC needs to be much shorter, and it is difficult for the conventional CDAC to meet the circuit requirement of much shorter settle time since the conventional method slowly and gradually raise up the level of the reference voltage signal after the significant voltage drop occurs in the reference voltage signal.

SUMMARY OF THE INVENTION

Therefore one of the objectives of the invention is to provide an electronic device and a corresponding method, to solve the above-mentioned problems.

According to embodiments of the invention, an electronic device is disclosed. The electronic device comprises a capacitive digital-to-analog converter, a reference voltage providing circuit, and a compensation circuit. The capacitive digital-to-analog converter has a reference voltage input. The reference voltage providing circuit is coupled to the capacitive digital-to-analog converter, and is arranged for generating a reference voltage to the reference voltage input of the capacitive digital-to-analog converter. The compensation circuit is coupled to the reference voltage input of the capacitive digital-to-analog converter, and is arranged for generating a compensation signal into the reference voltage input of the capacitive digital-to-analog converter in response to at least one switching of at least one capacitor in a switchable capacitor network of the capacitive digital-to-analog converter.

According to the embodiments, a method of an electronic device is disclosed. The method comprises: providing a capacitive digital-to-analog converter having a reference voltage input; providing a reference voltage providing circuit to generate a reference voltage to the reference voltage input of the capacitive digital-to-analog converter; and, generating a compensation signal into the reference voltage input of the capacitive digital-to-analog converter in response to at least one switching of at least one capacitor in a switchable capacitor network of the capacitive digital-to-analog converter.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a technical solution of an analog-to-digital conversion/converter (ADC) device such as a successive-approximation register (SAR) ADC device and a corresponding method which can be arranged to minimize a voltage drop occurring in a reference voltage provided for the SAR ADC device each time when the SAR ADC device's digital-to-analog conversion/converter (DAC) operation performs a bit conversion and can also be arranged to minimize the power consumption. The method can be arranged to predict one or more charge amounts drawn from the provided reference voltage based on the capacitance(s) of one or more capacitors in the SAR ADC device in response to different switching conditions/states of the one or more capacitors and can use the predicted one or more drawn charge amounts as one or more compensation charge amounts to implement corresponding circuit(s) to generate and provide the one or more compensation charge amounts to at least partially compensate the provided reference voltage in response to the different switching conditions/states of the one or more capacitors.

Figure 1:
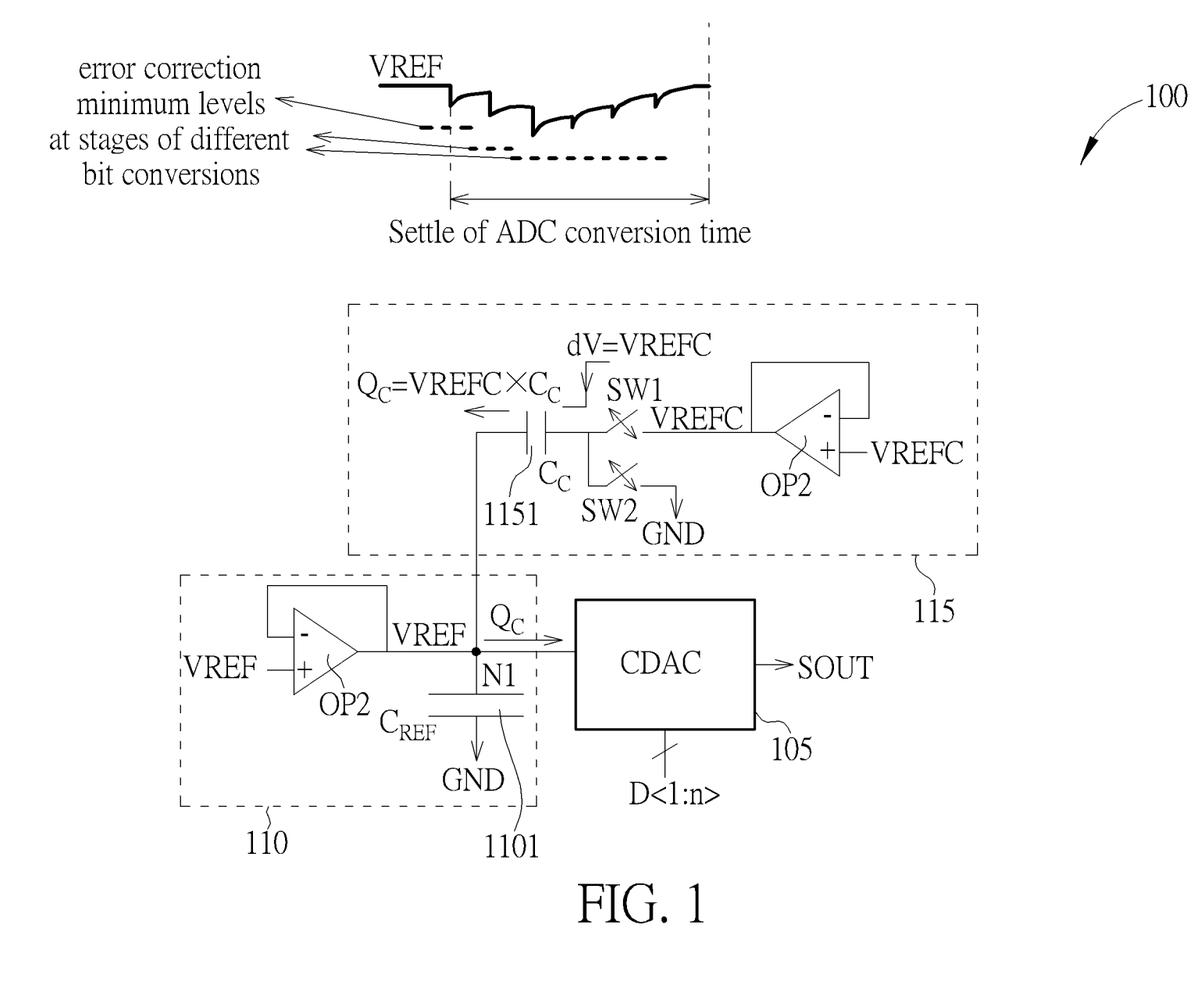
FIG. 1 is a diagram of an electronic device according to an embodiment of the invention.

FIG. 1 is a diagram of an electronic device 100 according to an embodiment of the invention. The electronic device 100 such as a SAR ADC device at least comprises a capacitive/capacitor digital-to-analog conversion/converter (CDAC) 105, a reference voltage providing circuit 110, and a compensation circuit 115. The SAR ADC deice 100 performs an ADC operation based on the SAR algorithm by using the DAC operation of the CDAC 105.

The reference voltage providing circuit 110 is configured inside the SAR ADC device 100 and coupled to the CDAC 105, and is arranged for generating a reference voltage VREF to a reference voltage input of the CDAC 105. It is not needed for the SAR ADC device 100 to further implement one additional pin to be coupled to an external reference voltage providing circuit. In addition, the SAR ADC device 100 consumes power less than a conventional SAR ADC device.

The CDAC 105 has the reference voltage input for receiving the reference voltage VREF, an output terminal for generating the analog output signal SOUT, and an input terminal for receiving the digital input signal D<1:n> having n data bits. The CDAC 105 is used for converting the digital input signal D<1:n> into the analog output signal SOUT so as to generate different analog voltage levels in response to different digital data bits. In addition, the CDAC 105 has a switchable capacitor network (not shown in FIG. 1). When the switchable capacitor network performs a capacitor switching (i.e. performing a bit conversion), the CDAC 105 draws a corresponding charge amount from the voltage level received at its reference voltage input, i.e. reference voltage VREF, and thus the level of reference voltage VREF at the reference voltage input will be lowered down, i.e. a corresponding voltage drop occurs in the reference voltage VREF. The corresponding charge amount may be different in response to different capacitors' switching.

For example, the reference voltage providing circuit 110 comprises an operational amplifier OP1 used as a buffer and a capacitor 1101 such as a loading capacitor having the capacitance $C_{REF}$. The operational amplifier OP1 has a first input (e.g. the negative input), a second input (e.g. positive input), and an output coupled to the first input. The capacitor 1101 is coupled between the ground level GND and the reference voltage input of the CDAC 105. The capacitor 1101 is a capacitive element having a larger capacitance $C_{REF}$, and the operational amplifier OP1 provides a high bandwidth such as 50 MHz (but not limited) which is not needed to much higher than that used by a conventional SAR ADC device, e.g. 1 GHz (but not limited). The high bandwidth can consume less power as well as can raise up the level of reference voltage VREF more rapidly if such level is lowered down. The capacitor 1101 is used to provide the reference voltage VREF at its first end (i.e. at the reference voltage input of the CDAC 105). Further, it should be noted that the larger capacitance $C_{REF}$ may be optional; in other embodiment, the capacitance $C_{REF}$ can be configured to be equal to or smaller than that used by the conventional SAR ADC device.

As mentioned above, the corresponding voltage drop, occurring in the reference voltage VREF, is associated with the capacitance $C_{REF}$ and the corresponding charge amount drawn from the reference voltage VREF into the CDAC 105. In one embodiment, the capacitance $C_{REF}$ is configured to be larger so as to decrease the corresponding voltage drop; for example (but not limited), the capacitance $C_{REF}$ may be ten or twenty times more than the capacitance used by a conventional ADC device. Also, the operational amplifier OP1 provides the high bandwidth such as 50 MHz so as to reduce the power consumption, when the SAR ADC device 100 is arranged to meet the data requirements of 30 Mbps (megabit per second) and 10 ns of the settle time requirement of ADC conversion operation. However, this is not intended to be a limitation.

Further, the compensation circuit 115 is coupled to the reference voltage input of the CDAC 105, and it is used for generating a corresponding compensation signal, carrying an estimated or predicted charge amount $Q_C$, into the reference voltage input of the CDAC 105 in response to at least one switching of at least one capacitor in the switchable capacitor network of the CDAC 105, wherein the capacitor switching causes an event that a charge amount is drawn by the CDAC 105 (i.e. a voltage drop occurs) and the compensation circuit 115 generates the compensation signal to compensate the drawn charge amount as far as possible to minimize the voltage drop. In addition, in response to different switching events (or switching conditions/states) of the switchable capacitor network of the CDAC 105, the compensation signal may carry different estimated or predicted charge amounts $Q_C$ to compensate different voltage drops occurring in the reference voltage input of the CDAC 105. In practice, the compensation circuit 115 is arranged to predict different drawn charge amounts drawn from the reference voltage VREF based on the different switching events of the switchable capacitor network and use the predicted different charge amounts to generate different compensation charge amounts into the node N1 in response to different switching conditions of capacitor(s).

In practice, for example (but not limited), in one embodiment, the compensation circuit 115 may comprise a capacitor 1151 having the capacitance $C_C$, two switch units SW1 and SW2, and an operational amplifier OP2. The operational amplifier OP2 is used as a buffer and has a first input terminal (e.g. negative input terminal), a second input terminal (e.g. positive input terminal), and an output terminal. The first input terminal of operational amplifier OP2 is coupled to its output terminal, and its second input terminal is coupled to a specific voltage level such as a compensation voltage VREFC. In one embodiment, the level of compensation voltage VREFC is equal to the level of reference voltage VREF inputted to the operational amplifier OP1. However, this is not intended to be a limitation. In other embodiment, the level of compensation voltage VREFC may be different from that of reference voltage VREF inputted to the operational amplifier OP1. It should be noted that the reference voltage VREF and the compensation voltage VREFC are respectively provided by two different voltage source circuits not shown in FIG. 1 even though the level of reference voltage VREF may be equal to that of compensation voltage VREFC. The level of compensation voltage VREFC is not affected by the switching conditions/states of the switchable capacitor network.

The estimated or predicted charge amount $Q_C$ can be indicated by the following equation:

$$Q_C = VREFC \times C_C$$

In one embodiment, if the level of compensation voltage VREFC is fixed and equal to the level of reference voltage VREF inputted to the operational amplifier OP1, then the compensation circuit 115 is arranged to predict different capacitances as $C_C$ in response to different switching conditions of capacitor(s) so as to provide different corresponding predicted charge amounts as $Q_C$ as compensation charge amounts into the node N1. If the level of compensation voltage VREFC is changed, then the compensation circuit 115 can control and correspondingly change the capacitance $C_C$ so as to provide an enough or appropriate compensation charge amount.

The switch unit SW1 is selectively coupled between the capacitor 1151 having the capacitance $C_C$ and the output terminal of operational amplifier OP2. When no events of switching of capacitor unit(s) occur, the compensation circuit 115 controls the switch unit SW1 being turned off (open state) to disconnect the coupling between the capacitor 1151 and the output terminal of the operational amplifier OP2, and it controls the switch unit SW2 being turned on (closed state) to establish the coupling between the capacitor 1151 and the ground level GND. Thus, in this situation, the compensation circuit 115 does not provide a charge amount to the node N1. Then, once an event that a switching of capacitor unit(s)

occurs, the compensation circuit 115 controls the switch unit SW1 being turned on (closed state) to rapidly establish the coupling between the capacitor 1151 and the output terminal of the operational amplifier OP2, and it controls the switch unit SW2 being turned off (open state) to rapidly disconnect the coupling between the capacitor 1151 and the ground level GND. Accordingly, a voltage difference dV=VREFC occurs at the intermediate node between the capacitor 1151 and the switch unit SW1, and the voltage level rapidly becomes VREFC from the ground level GND since the voltage level provided from the output terminal of operational amplifier OP2 is equal to VREFC. The predicted compensation charge amount $Q_C$=VREFC×$C_C$ is generated and provided from the compensation circuit 115 into the node N1 to at least partially compensate the charge amount drawn into the CDAC 105 when the level of the reference voltage VREF at the node N1 becomes lower.

Based on the operations of the compensation circuit 115, each time when the level of the reference voltage VREF is rapidly lower down to a lower level due to a capacitor switching event occurring in the CDAC 105, the compensation circuit 115 can rapidly raise up the level from the lower level into a higher level during a specific time period. For example (but not limited), as shown in FIG. 1, the level of voltage VREF can be rapidly raised up to a higher level each time when the level of voltage VREF has a voltage drop during the whole settle time period of SAR ADC conversion operation of the CDAC, so that the calibrated level of reference voltage VREF can be within the tolerable error correction voltage ranges required for different stages of different bit conversions; that is, the calibrated levels can be at least higher than the different minimum error correction levels for the different bit conversions. This effectively ensures that the slightly lowered down level still is higher than the required levels at different stages of different bit conversions even though the level of reference voltage VREF at the node N1 is lowered down.

Figure 2:
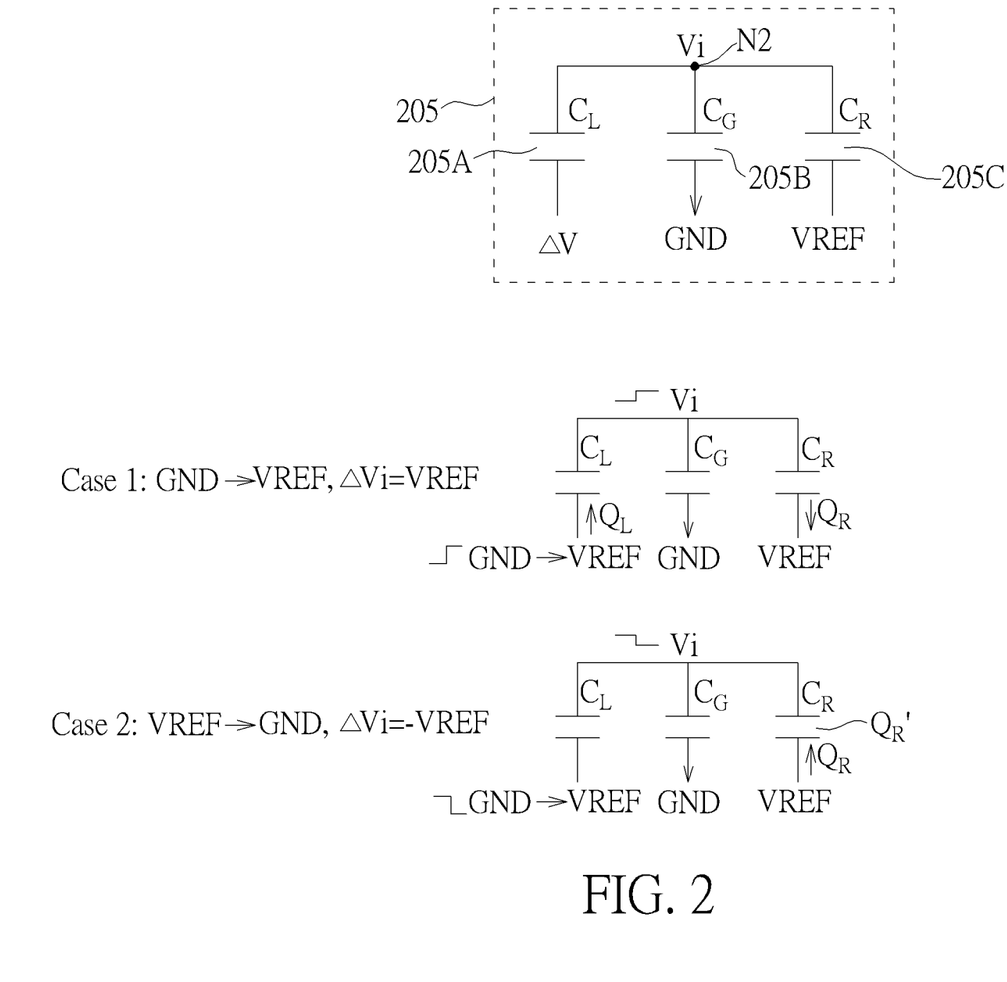
FIG. 2 is a schematic diagram of scenario examples of the compensation circuit's principle operation for predicting and measuring a compensation charge amount during one capacitor switching according to an embodiment of the invention.

FIG. 2 is a schematic diagram of scenario examples of the compensation circuit's 115 principle operation for predicting and measuring a compensation charge amount during one capacitor switching event according to an embodiment of the invention. As shown in FIG. 2, the circuit block 205 for example (but not limited) is a simplified example of a switchable capacitor network comprised by the CDAC 105, and it comprises a first capacitor 205A, a second capacitor 205B, and a third capacitor 205C connected in parallel wherein the first, second, and third capacitors 205A-205C respectively have the capacitance $C_L$, $C_G$, and $C_R$. The second capacitor 205B is coupled between an intermediate node N2 and the ground level GND, and the third capacitor 205C is coupled between the intermediate node N2 and the reference voltage VREF. The first capacitor 205A has a first end coupled to the intermediate node N2 and has a second end coupled to a voltage level which will be changed with a voltage difference ΔV, and the voltage difference ΔV may be positive (+VREF) if the first capacitor's 205A second end is switched from the ground level GND (i.e. zero) to the reference voltage VREF, or it may be negative (−VREF) if the first capacitor's 205A second end is switched from the reference voltage VREF to the ground level GND (i.e. zero).

Based on the parallel connection circuit structure and a voltage division principle, the voltage change $\Delta V_i$ of the level Vi at the intermediate node N2 will be changed in response to the voltage difference/change ΔV and can be indicated by the following equation:

$$\Delta V_i = \Delta V \times \frac{C_L}{C_L + C_G + C_R}.$$

Ina first scenario case (but not limited) of FIG. 2, the voltage difference/change ΔV is positive, and the level at the second end of the first capacitor 205A is rapidly switched from a lower level such as the ground level GND into a higher level such as the reference voltage VREF during one capacitor switching. In this situation, the charge amount $Q_L$, caused due to the voltage pulse and drawn from the reference voltage VREF into the capacitor network 205 to increase the level Vi, is indicated by the following equation and generated at the second end of the first capacitor 205A:

$$Q_L = VREF \times \frac{C_L \times (C_G + C_R)}{C_L + C_G + C_R}.$$

When the level of voltage Vi is increased, the increased voltage change/difference $\Delta V_i$ causes that the charge amount $Q_R$ indicated by the following equation is generated at the second end of third capacitor 205C and outputted from the capacitor network 205 to be provided back to the reference voltage VREF:

$$Q_R = \Delta V_i \times C_R = VREF \times \frac{C_L \times C_R}{C_L + C_G + C_R}.$$

Thus, the totally drawn charge amount $Q_D$ from the reference voltage VREF can be indicated by the following equation:

$$Q_D = Q_L - Q_R = \frac{VREF \times C_L \times C_G}{C_L + C_G + C_R}.$$

That is, in this example, when the first capacitor 205A is switched from the ground level GND to the reference voltage VREF, the totally drawn charge amount $Q_D$ from the reference voltage VREF, predicted by the compensation circuit 115, is proportional to $C_L \times C_G$ (i.e. the capacitance of a switching capacitor multiplied by the capacitance(s) of non-switching capacitor(s) which is/are coupled to the ground level GND) and is inversely proportional to $C_L+C_G+C_R$ (i.e. the totally sum of capacitances of switching and non-switching capacitors).

Further, in a second scenario case (but not limited) of FIG. 2, the voltage difference/change ΔV is negative, and the level at the second end of the first capacitor 205A is rapidly switched from a higher level such as the reference voltage VREF into a lower level such as the ground level GND during one capacitor switching. In this situation, the level Vi will be decreased, and the decreased voltage change/difference $\Delta V_i$ will cause that a charge amount $Q_R'$ is drawn from the reference voltage VREF to the capacitor network 205. The totally drawn charge amount $Q_D'$ from the reference voltage VREF in this example can be indicated by the following equation:

$$Q_D' = Q_R = \Delta V_i^* C_R = \frac{VREF \times C_L \times C_G}{C_L + C_G + C_R}.$$

That is, in this example, when the first capacitor 205A is switched from the reference voltage VREF to the ground level GND, the totally drawn charge amount $Q_D'$ from the reference voltage VREF, predicted by the compensation circuit 115, is proportional to $C_L \times C_R$ (i.e. the capacitance of a switching capacitor multiplied by the capacitance(s) of non-switching capacitor(s) which is/are coupled to the reference voltage VREF) and is inversely proportional to $C_L + C_G + C_R$ (i.e. the totally sum of capacitances of switching and non-switching capacitors). By doing so, this method can dynamically predict and provide different compensation charge amounts as the compensation charge amount $Q_C$ into the node N1 of FIG. 1 and for the CDAC 105 when it is in different switching conditions.

Further, this method can use different levels of the compensation voltage VREFC to generate the different compensation charge amounts. Equivalently, this method predicts the charge amount needed by the CDAC 105 and then generates at least partial charge amount for the CDAC 105.

Figure 3:
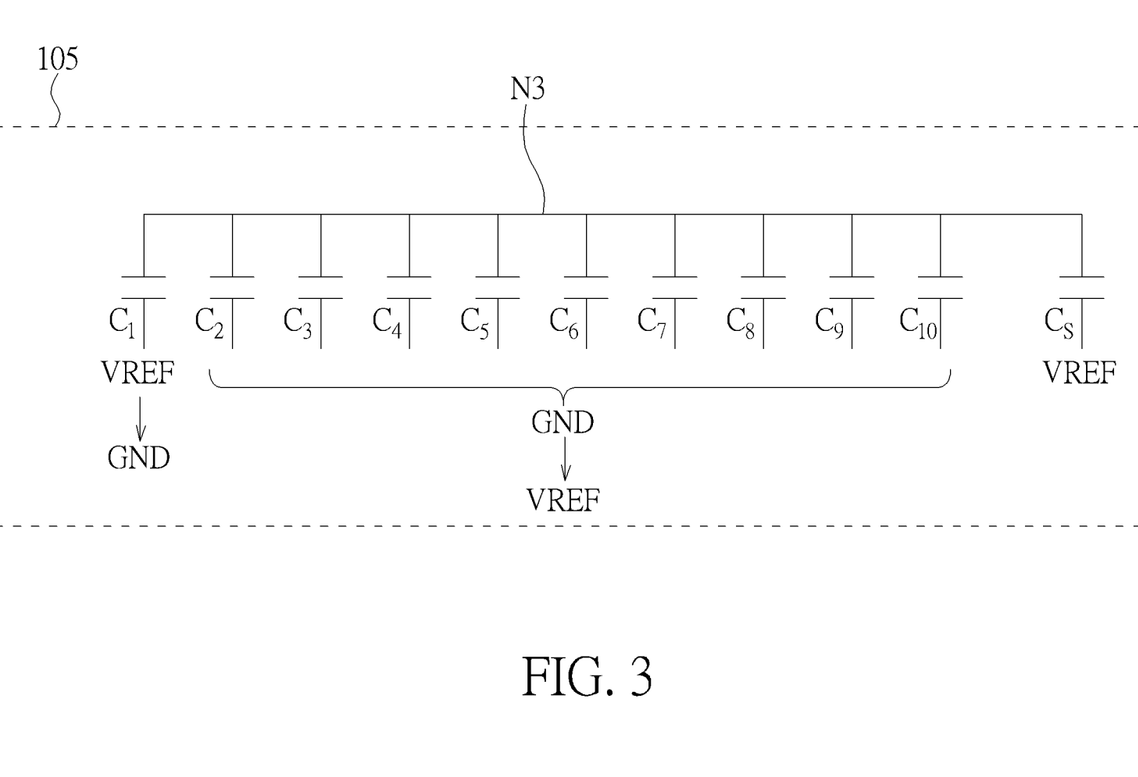
FIG. 3 is a schematic diagram of a scenario example of a capacitor network comprised by the CDAC in FIG. 1 according to an embodiment of the invention.

In this embodiment, in practice, the compensation circuit 115 can predict to generate different charge amounts that are associated with different switching conditions of capacitor switching. FIG. 3 is a schematic diagram of a scenario example of a switchable capacitor network comprised by the CDAC in FIG. 1 according to an embodiment of the invention. As shown in FIG. 3, the CDAC 105 is a switchable capacitor network which at least comprises multiple capacitors connected in parallel, e.g. ten capacitors $C_1$, $C_2$, $C_3$, ..., and $C_{10}$ (but not limited). The first ends (i.e. top plates) of all the ten capacitors $C_1$, $C_2$, $C_3$, ..., and $C_{10}$ are coupled together to the output node N3 (i.e. an output node of CDAC 105 for outputting the converted analog signal/voltage), and their second ends (i.e. bottom plates) can be respectively coupled to the reference voltage VREF or the ground level GND through switch units (not shown in FIG. 3). Their second ends equivalently can be switched between the reference voltage VREF and the ground level GND. Initially, based on the SAR algorithm, for a first bit conversion (i.e. the most significant bit (MSB) conversion), the bottom plate of capacitor $C_1$ is coupled to the reference voltage VREF while the bottom plates of the other capacitors $C_2$, $C_3$, ..., and $C_{10}$ are coupled to the ground level GND.

For example (but not limited), the capacitances of capacitors' $C_1$, $C_2$, $C_3$, ..., and $C_{10}$ are respectively configured as and equal to 252×Cap, 116×Cap, 64×Cap, 36×Cap, 20×Cap, 10×Cap, 6×Cap, 4×Cap, 2×Cap, and 1×Cap, respectively, wherein Cap indicates a capacitance value or a specific measurement capacitance unit. The capacitances 252×Cap, 116×Cap, 64×Cap, 36×Cap, 20×Cap, 10×Cap, 6×Cap, 4×Cap, 2×Cap, and 1×Cap are simplified as values 252, 116, 64, 36, 20, 10, 6, 4, 2, and 1.

In addition, the scaling capacitor $C_S$, further comprised by the CDAC 105, is coupled between the node N3 and the reference voltage VREF, and its capacitance value is configured to be 257×Cap which can be simplified as a number 257; this is not intended to be a limitation of the invention. The bottom plate of scaling capacitor $C_S$ is maintained at the reference voltage VREF. The total capacitance of the capacitor network is equal to 768×Cap which can be simplified as a number 768. The scaling capacitor $C_S$ is optional.

In a first step, for the switching of capacitor $C_1$, the second end of capacitor $C_1$ may be switched from the reference voltage VREF to the ground level GND, and the second ends of the other capacitors $C_2$, $C_3$, ..., and $C_{10}$ are maintained at the ground level GND respectively (i.e. non-switching capacitors). Based on the principle operation of FIG. 2, the charge amount $Q_{D1a}$ drawn from the reference voltage VREF in response to the switching of capacitor $C_1$ can predicted by the compensation circuit 115 and used as a first compensation charge amount for the first step, and it can be indicated by the following equation:

$$Q_{D1a} = \frac{252 \times 257}{768} \times VREF \cong 84 \times VREF.$$

In a second step, for the switching of capacitor $C_2$, the capacitor $C_2$ is a switching capacitor, and the other capacitors are non-switching capacitors. Based on the principle operation of FIG. 2, the compensation circuit 115 determines that the capacitor $C_1$ does not draw a further charge amount from the reference voltage VREF when the capacitor $C_2$ is switched from the ground level GND to the reference voltage VREF and the bottom plate of capacitor $C_1$ is coupled to the reference voltage VREF. The compensation circuit 115 in the second step may generate two different compensation charge amounts by predicting a charge amount $Q_{D2a}$ drawn by the capacitor $C_1$ if the capacitor $C_1$ is coupled to the ground level GND when the capacitor $C_2$ is switched from the ground level GND to the reference voltage VREF and predicting another charge amount $Q_{D2b}$ drawn by the capacitors $C_3$-$C_{10}$ when the capacitor $C_2$ performs switching). The charge amounts $Q_{D2a}$ and $Q_{D2b}$ can be indicated by the following equations:

$$Q_{D2a} = \frac{116 \times 252}{768} \times VREF \cong 38 \times VREF;$$

$$Q_{D2b} = \frac{116 \times (64 + 36 + 20 + 10 + 6 + 4 + 2 + 1)}{768} \times VREF = \frac{116 \times 143}{768} \times VREF \cong 22 \times VREF.$$

Similarly, in a third step, for the switching of capacitor $C_3$, the capacitor $C_3$ is a switching capacitor, and the other capacitors are non-switching capacitors. Based on the principle operation of FIG. 2, the compensation circuit 115 determines that the capacitor $C_1$ and capacitor $C_2$ do not draw further charge amounts from the reference voltage VREF when the capacitor $C_2$ is switched from the ground level GND to the reference voltage VREF and the bottom plates of capacitor $C_1$ and capacitor $C_2$ is coupled to the reference voltage VREF. The compensation circuit 115 in the third step may generate three different compensation charge amounts by predicting a charge amount $Q_{D3a}$ drawn by the capacitor $C_1$ if the capacitor $C_1$ is coupled to the ground level GND when the capacitor $C_3$ is switched from the ground level GND to the reference voltage VREF, a charge amount $Q_{D3b}$ drawn by the capacitor $C_2$ if the capacitor $C_2$ is coupled to the ground level GND when the capacitor $C_3$ is switched from the ground level GND to the reference voltage VREF, and a charge amount $Q_{D3c}$ drawn by the capacitors $C_4$-$C_{10}$ when the capacitor $C_3$ performs switching). The charge amounts $Q_{D3a}$, $Q_{D3b}$, and $Q_{D3c}$ can be indicated by the following equations:

$$Q_{D3a} = \frac{64 \times 252}{768} \times VREF \cong 21 \times VREF;$$

$$Q_{D3b} = \frac{64 \times 116}{768} \times VREF \cong 10 \times VREF;$$

-continued $$Q_{D3c} = \frac{116 \times (36 + 20 + 10 + 6 + 4 + 2 + 1)}{768} \times VREF =$$

$$\frac{64 \times 79}{768} \times VREF \cong 6.5 \times VREF.$$

Similarly, the compensation circuit 115 can be arranged to predict the charge amounts drawn by different capacitors when the other capacitors perform switching so as to generate different compensation charge amounts. For example (but not limited), the following table shows the ratio/factors results of different drawn charge amounts predicted by the compensation circuit 115 for the different capacitors:

| | $C_1$ (252) | $C_2$ (116) | $C_3$ (64) | $C_4$ (36) | $C_5$ (20) | $C_6$ (10) | $C_7$ (6) | $C_8$ (4) | $C_9$ (2) | $C_{10}$ (1) |
|---|---|---|---|---|---|---|---|---|---|---|
| $Q_{Da}$ | 84 | 38 | 21 | 12 | 7 | 3 | 2 | 1 | 1 | |
| $Q_{Db}$ | | 22 | 10 | 5 | 3 | 2 | 1 | 1 | | |
| $Q_{Dc}$ | | | 6.5 | 3 | 2 | 1 | 1 | | | |
| $Q_{Dd}$ | | | | 2 | 1 | 0 | 0 | | | |
| $Q_{De}$ | | | | | 1 | 0 | 0 | | | |
| $Q_{Df}$ | | | | | | 0 | 0 | | | |
| $Q_{Dg}$ | | | | | | | 0 | | | |

As mentioned above, $Q_{Da}$-$Q_{Dg}$ respectively indicate the different charge amounts drawn by different capacitors when different capacitor perform switching. The different values of drawn charge amounts shown by the table can be regarded as different compensation ratios/factors which will be used to implement one or more circuit components to generate and provide the corresponding compensation charge amount(s).

Further, in other embodiments, the compensation circuit 115 may not generate other compensation charge amounts for the other less significant bit(s) to reduce computation complexity since the needed compensation charge amounts of the other less significant bits become smaller.

Figure 4:
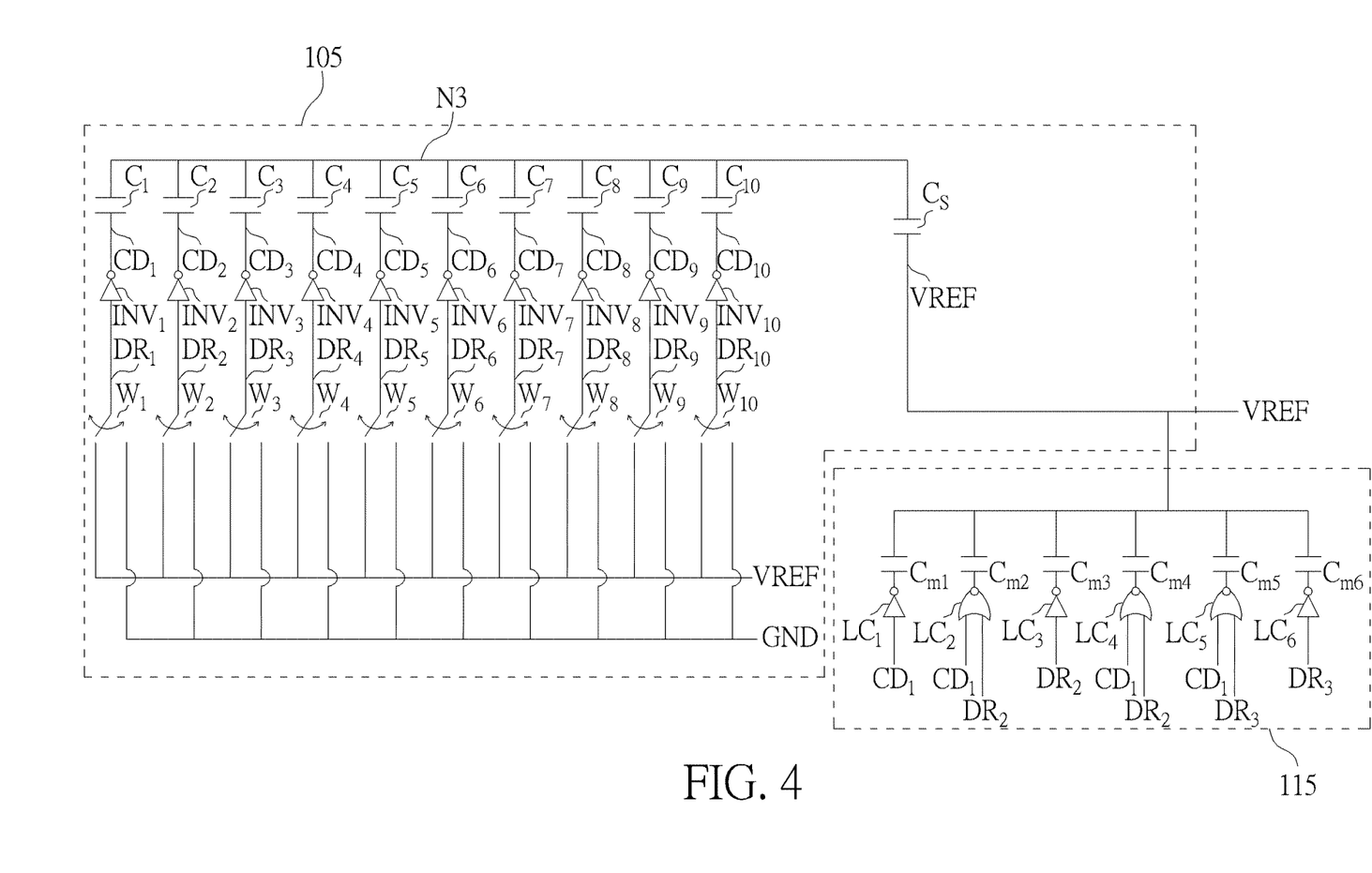
FIG. 4 is a diagram of an example of the blocks of CDAC and compensation circuit according to an embodiment of the invention.

FIG. 4 is a diagram of an example of the blocks of CDAC 105 and compensation circuit 115 according to an embodiment of the invention. As shown in FIG. 4, for example (but not limited), the CDAC 105 is a switchable capacitor network which comprises a plurality of specific capacitors such as ten capacitors $C_1$-$C_{10}$, a plurality of specific inverters such as ten corresponding inverters $INV_1$-$INV_{10}$, a plurality of switch units such as ten corresponding switch units $W_1$-$W_{10}$, and the scaling capacitor $C_S$. The capacitors $C_1$-$C_{10}$, respectively corresponding to a digital decision signal having different data bits determined by the SAR ADC device 100, have first ends (i.e. top plates) coupled together to the node N3, and have second ends (i.e. bottom plates) which are respectively coupled to corresponding outputs of the corresponding inverters $INV_1$-$INV_{10}$. The inputs of the corresponding inverters $INV_1$-$INV_{10}$ are respectively coupled to outputs of the corresponding switch units $W_1$-$W_{10}$. The corresponding switch units $W_1$-$W_{10}$ respectively have first inputs coupled to the reference voltage VREF and second inputs coupled to the ground level GND. The corresponding switch units $W_1$-$W_{10}$ can be controlled to perform switching to select the reference voltage VREF as its output or to select the ground level GND as its output. Accordingly, the signals $DR_1$-$DR_{10}$ respectively at the outputs of the switch units $W_1$-$W_{10}$ may be at the ground level GND or at the level of reference voltage VREF through the controls of the switch units $W_1$-$W_{10}$. The inverters $INV_1$-$INV_{10}$ are used for inverting the signals $DR_1$-$DR_{10}$ to generate corresponding inverted signals $CD_1$-$CD_{10}$ which are coupled to the bottom plates of the capacitors $C_1$-$C_{10}$. The signals $DR_1$-$DR_{10}$ and signals $CD_1$-$CD_{10}$ are used as control signals fed into the compensation circuit 115.

For generating the predicted drawn charge amount(s) as compensation charge amount(s), the compensation circuit 115 comprises the scaling capacitor $C_S$, one or more compensation capacitors corresponding to one or more predicted drawn charge amounts, and one or more logic circuit units correspondingly coupled to the one or more compensation capacitors and arranged to receive one or more control signals from the CDAC 105. In practice, as shown in FIG. 4, for example (but not limited), six compensation capacitors $C_{m1}$-$C_{m6}$ and six corresponding logic circuit units $LC_1$-$LC_6$ are disposed within the compensation circuit 115; however, the number of compensation capacitors (or logic circuit units) is not meant to be a limitation. In other embodiments, other different numbers of compensation capacitors (or logic circuit units) may be comprised by the compensation circuit 115 to provide different numbers of compensation charge amounts.

The compensation capacitors $C_{m1}$-$C_{m6}$ respectively have first ends (i.e. top plates) coupled together to one end (i.e. bottom plate) of the scaling capacitor $C_S$, i.e. the level of reference voltage VREF. The second ends (i.e. bottom plates) of compensation capacitors $C_{m1}$-$C_{m6}$ are respectively coupled to the outputs of the logic circuit units $LC_1$-$LC_6$. The capacitances of the compensation capacitors $C_{m1}$-$C_{m6}$ are configured by the compensation circuit 115 based on the drawn charge amounts predicted by the compensation circuit 115 in the above-mentioned table or can be configured to be proportional to the predicted or measured drawn charge amounts, and then the compensation circuit 115 can control the compensation capacitors $C_{m1}$-$C_{m6}$ to respectively generate and provide the different compensation charge amounts in response to the different switching events of the switchable capacitor network. For example (but not limited), the capacitances of the compensation capacitors $C_{m1}$-$C_{m6}$ may be respectively configured as the compensation ratios/factors, shown by the table in the aforementioned paragraph, multiplied by the capacitance value or the specific measurement capacitance unit Cap. The capacitances of the compensation capacitors $C_{m1}$-$C_{m6}$ are respectively equal to 84×Cap, 38×Cap, 22×Cap, 21×Cap, 10×Cap, and 6.5×Cap, respectively; the capacitances 84×Cap, 38×Cap, 22×Cap, 21×Cap, 10×Cap, and 6.5×Cap are simplified as values 84, 38, 22, 21, 10, and 6.5.

For the first important bit conversion, the logic circuit unit $LC_1$, associated with the drawn charge amount due to the switching of the capacitor $C_1$, is implemented as an inverter which receives the inverted control signal $CD_1$ to generate an output signal to the bottom plate of compensation capacitor $C_{m1}$. That is, for the first important bit conversion, i.e. MSB bit conversion, only one set of compensation capacitor and logic control unit is needed.

For the second important bit conversion, the logic circuit unit $LC_2$, associated with the drawn charge amount drawn by the capacitor $C_1$ due to the switching of the capacitor $C_2$, is implemented as a NOR gate which receives the inverted control signal $CD_1$ and the control signal $DR_2$ to generate an output signal to the bottom plate of compensation capacitor $C_{m2}$. The logic circuit unit $LC_3$, associated with the drawn charge amount drawn by the other capacitors $C_3$-$C_{10}$ (i.e. excluding the capacitor $C_1$) due to the switching of the capacitor $C_2$, is implemented as an inverter which receives the control signal $DR_2$ to generate an output signal to the bottom plate of compensation capacitor $C_{m3}$. That is, for the second important bit conversion, two sets of compensation capacitors and logic control units are needed.

For the third important bit conversion, the logic circuit unit $LC_4$, associated with the drawn charge amount drawn by the capacitor $C_1$ due to the switching of the capacitor $C_3$, is implemented as a NOR gate which receives the inverted control signal $CD_1$ and the control signal $DR_3$ to generate an output signal to the bottom plate of compensation capacitor $C_{m4}$. The logic circuit unit $LC_5$, associated with the drawn charge amount drawn by the capacitor $C_2$ due to the switching of the capacitor $C_3$, is implemented as a NOR gate which receives the inverted control signal $CD_2$ and the control signal $DR_3$ to generate an output signal to the bottom plate of compensation capacitor $C_{m5}$. The logic circuit unit $LC_6$, associated with the drawn charge amount drawn by the other capacitors $C_4$-$C_{10}$ (i.e. excluding the capacitors $C_1$ and $C_2$) due to the switching of the capacitor $C_3$, is implemented as an inverter which receives the control signal $DR_3$ to generate an output signal to the bottom plate of compensation capacitor $C_{m6}$. That is, for the third important bit conversion, two sets of compensation capacitors and logic control units are needed.

In practice, to compensate charge amounts for multiple bit conversions such as N bits, N×(N−1) sets of compensation capacitors and logic control units are needed. However, this is not intended to be a limitation.

For the operation, initially the switch unit $W_1$ selects the ground level GND as its output and the other switch units $W_2$-$W_{10}$ select the reference voltage VREF as their outputs, so that the capacitor $C_1$ is coupled to the reference voltage VREF while the other capacitors $C_2$-$C_{10}$ are coupled to the ground level GND. Then, for the first important bit conversion, to make the capacitor $C_1$ be switched from the reference voltage VREF to the ground level GND, the switch unit $W_1$ changes to select the reference voltage VREF as its output, and accordingly the level of control signal $DR_1$ is switched to the reference voltage VREF while the level of control signal $CD_1$ is switched to the ground level GND. In this situation, the output of the logic circuit unit $LC_1$ (i.e. an inverter) is switched from the ground level GND to the reference voltage VREF due to that the level of control signal $CD_1$ is switched from the reference voltage level VREF to the ground level GND, so that the compensation capacitor $C_{m1}$ is switched from the ground level GND to the reference voltage VREF so as to provide a compensation charge amount $Q_{EC1a}$ back to the reference voltage VREF to minimize a voltage drop occurring in the reference voltage VREF.

For the second important bit conversion, to make the capacitor $C_2$ be switched from the ground level GND to the reference voltage VREF, the switch unit $W_2$ changes to select the ground level GND as its output, and accordingly the level of control signal $DR_2$ is switched to the ground level GND while the level of control signal $CD_2$ is switched to the reference voltage VREF. In this situation, the output of the logic circuit unit $LC_2$ (i.e. a NOR gate) is switched from the ground level GND to the reference voltage VREF when the level of control signal $CD_1$ is switched to the ground level GND and the level of control signal $DR_2$ is switched to the ground level GND, so that the compensation capacitor $C_{m2}$ can be switched from the ground level GND to the reference voltage VREF so as to provide a compensation charge amount $Q_{EC2a}$ back to the reference voltage VREF to minimize a voltage drop occurring in the reference voltage VREF. In addition, the output of the logic circuit unit $LC_3$ (i.e. an inverter) can be switched from the ground level GND to the reference voltage VREF when the level of control signal $DR_2$ is switched from the reference voltage level VREF to the ground level GND, so that the compensation capacitor $C_{m3}$ is switched from the ground level GND to the reference voltage VREF so as to provide a compensation charge amount $Q_{EC2b}$ back to the reference voltage VREF to minimize a voltage drop occurring in the reference voltage VREF.

Similarly, for the third important bit conversion, the outputs of the logic circuit units $LC_4$-$LC_6$ (i.e. two NOR gates and one inverter) can be respectively switched from the ground level GND to the reference voltage VREF when the levels of corresponding control signals are switched, so that the compensation capacitors $C_{m4}$-$C_{m6}$ can be switched from the ground level GND to the reference voltage VREF so as to provide different compensation charge amounts back to the reference voltage VREF to minimize voltage drops occurring in the reference voltage VREF. The corresponding operations are not detailed again for brevity.

In addition, in one embodiment, the compensation circuit 115 can be used to only compensate a voltage drop caused by the switching of the capacitor $C_1$ without compensating voltage drops caused by the switching of the other capacitors. In this situation, the compensation circuit 115 can be arranged to power up only the logic control unit $LC_1$ and power down the other logic circuit units. That is, the compensation circuit 115 can determine whether to power down a portion of logic control units to disable other compensation operations.

Further, the above-mentioned compensation capacitors can be implemented by using transistors which are powered by the compensation circuit 115. When the compensation circuit 115 controls a particular compensation capacitor providing a corresponding compensation charge amount for the CDAC 105, the compensation circuit 115 can disable or power down one or more other compensation capacitors and corresponding logic control units. Additionally, in other embodiment, the capacitances of the compensation capacitors may be configured by further referring to identical or different parameters which can be set by users.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
a capacitive digital-to-analog converter, having a reference voltage input;
a reference voltage providing circuit, coupled to the capacitive digital-to-analog converter, for generating a reference voltage to the reference voltage input of the capacitive digital-to-analog converter; and
a compensation circuit, coupled to the reference voltage input of the capacitive digital-to-analog converter, for generating a compensation signal into the reference voltage input of the capacitive digital-to-analog converter in response to at least one switching of at least one capacitor in a switchable capacitor network of the capacitive digital-to-analog converter;
wherein the electronic device is a successive-approximation register analog-to-digital converter (SAR ADC) device, and the switchable capacitor network comprises:
a plurality of switch units;
a plurality of specific inverters;

a plurality of specific capacitors respectively corresponding to a digital decision signal having different data bits determined by the SAR ADC device, the plurality of specific capacitors respectively having first ends coupled together to an output node of the capacitive digital-to-analog converter and respectively having second ends being selectively coupled to one of the reference voltage and a ground level respectively through the plurality of switch units and the plurality of specific inverters; and a second capacitor, coupled between the output node of the capacitive digital-to-analog converter and the reference voltage input of the capacitive digital-to-analog converter.

2. The electronic device of claim 1, wherein the compensation circuit is used for generating the compensation signal carrying different compensation charge amounts into the reference voltage input of the capacitive digital-to-analog converter to compensate different voltage drops occurring in the reference voltage input of the capacitive digital-to-analog converter in response to different switching events of the switchable capacitor network of the capacitive digital-to-analog converter.

3. The electronic device of claim 2, wherein the compensation circuit is arranged to predict different charge amounts drawn from the reference voltage based on the different switching events of the switchable capacitor network, and then is arranged to use the predicted different charge amounts to generate the different compensation charge amounts.

4. The electronic device of claim 3, wherein the compensation circuit is arranged to configure capacitances of multiple compensation capacitors respectively based on the predicted different charge amounts drawn from the reference voltage, and then is arranged to control the multiple compensation capacitors to respectively generate and provide the different compensation charge amounts in response to the different switching events of the switchable capacitor network.

5. The electronic device of claim 1, wherein the reference voltage providing circuit comprises:
an operational amplifier having a first input, a second input, and an output coupled to the first input; and
a first capacitor, coupled between a ground level and the reference voltage input of the capacitive digital-to-analog converter.

6. The electronic device of claim 1, wherein the compensation circuit comprises:
a first compensation capacitor having a first end coupled to the reference voltage input of the capacitive digital-to-analog converter and a second end coupled to an output of a first logic control unit; and
the first logic control unit, implemented as an inverter coupled between the first compensation capacitor and a first control signal generated by a specific inverter within the switchable capacitor network;
wherein the specific inverter is associated with a first important bit of the digital decision signal; a capacitance of the first compensation capacitor is configured to be proportional to a predicted drawn charge amount caused due to a switching of a specific capacitor associated with the first important bit.

7. The electronic device of claim 6, wherein the compensation circuit further comprises:
a plurality of second logic control units; and
a plurality of second compensation capacitors, each second compensation capacitor having a first end coupled to the reference voltage input of the capacitive digital-to-analog converter and a second end coupled to an output of a second logic control unit;

wherein a specific second logic control unit is implemented as an inverter to receive a second control signal generated by a specific switch unit in the plurality of switch units of the switchable capacitor network, and at least one another second logic control unit is implemented as a NOR gate being arranged to receive the second control signal and an output signal of another specific inverter comprised by the switchable capacitor network.

8. A method of an electronic device, comprising:
providing a capacitive digital-to-analog converter having a reference voltage input;
providing a reference voltage providing circuit to generate a reference voltage to the reference voltage input of the capacitive digital-to-analog converter; and
generating a compensation signal into the reference voltage input of the capacitive digital-to-analog converter in response to at least one switching of at least one capacitor in a switchable capacitor network of the capacitive digital-to-analog converter;
wherein the electronic device is a successive-approximation register analog-to-digital converter (SAR ADC) device, and the method further comprises:
providing the switchable capacitor network having:
a plurality of switch units;
a plurality of specific inverters;
a plurality of specific capacitors respectively corresponding to a digital decision signal having different data bits determined by the SAR ADC device, the plurality of specific capacitors respectively having first ends coupled together to an output node of the capacitive digital-to-analog converter and respectively having second ends being selectively coupled to one of the reference voltage and a ground level respectively through the plurality of switch units and the plurality of specific inverters; and
a second capacitor, coupled between the output node of the capacitive digital-to-analog converter and the reference voltage input of the capacitive digital-to-analog converter.

9. The method of claim 8, further comprising:
generating the compensation signal carrying different compensation charge amounts into the reference voltage input of the capacitive digital-to-analog converter to compensate different voltage drops occurring in the reference voltage input of the capacitive digital-to-analog converter in response to different switching events of the switchable capacitor network of the capacitive digital-to-analog converter.

10. The method of claim 9, further comprising:
predicting different charge amounts drawn from the reference voltage based on the different switching events of the switchable capacitor network; and
using the predicted different charge amounts to generate the different compensation charge amounts.

11. The method of claim 10, further comprising:
configuring capacitances of multiple compensation capacitors respectively based on the predicted different charge amounts drawn from the reference voltage; and
controlling the multiple compensation capacitors to respectively generate and provide the different compensation charge amounts in response to the different switching events of the switchable capacitor network.

12. The method of claim 8, further comprising:
providing the reference voltage providing circuit having:
- an operational amplifier having a first input, a second input, and an output coupled to the first input; and
- a first capacitor, coupled between a ground level and the reference voltage input of the capacitive digital-to-analog converter.

13. The method of claim 8, further comprising:
providing a first compensation capacitor having a first end coupled to the reference voltage input of the capacitive digital-to-analog converter and a second end coupled to an output of a first logic control unit;
providing the first logic control unit, implemented as an inverter coupled between the first compensation capacitor and a first control signal generated by a specific inverter within the switchable capacitor network; wherein the specific inverter is associated with a first important bit of the digital decision signal; and
configuring a capacitance of the first compensation capacitor to be proportional to a predicted drawn charge amount caused due to a switching of a specific capacitor associated with the first important bit.

14. The method of claim 13, further comprising:
providing a plurality of second logic control units;
providing a plurality of second compensation capacitors, each second compensation capacitor having a first end coupled to the reference voltage input of the capacitive digital-to-analog converter and a second end coupled to an output of a second logic control unit;
providing a specific second logic control unit implemented as an inverter to receive a second control signal generated by a specific switch unit in the plurality of switch units of the switchable capacitor network; and
providing at least one another second logic control unit implemented as a NOR gate being arranged to receive the second control signal and an output signal of another specific inverter comprised by the switchable capacitor network.

* * * * *